(12) United States Patent
Chen

(10) Patent No.: US 7,632,150 B2
(45) Date of Patent: Dec. 15, 2009

(54) PCB WITH IMPROVED SOLDERING HOLES AND A BATTERY SET WITH THE SAME

(75) Inventor: Ming-Ta Chen, Hukou Township, Hsinchu County (TW)

(73) Assignee: Simplo Technology Co., Ltd., Hsinchu Hsien (TW)

(*) Notice: Subject to any disclaimer, the term of this patent is extended or adjusted under 35 U.S.C. 154(b) by 176 days.

(21) Appl. No.: 12/007,017

(22) Filed: Jan. 4, 2008

(65) Prior Publication Data

US 2009/0124099 A1 May 14, 2009

(30) Foreign Application Priority Data

Nov. 14, 2007 (TW) .............................. 96219229 U

(51) Int. Cl.
*H01M 2/10* (2006.01)
(52) U.S. Cl. ........................................ 439/627; 429/99
(58) Field of Classification Search ................. 439/627; 429/99; 361/328
See application file for complete search history.

(56) References Cited

U.S. PATENT DOCUMENTS

| | | | | | |
|---|---|---|---|---|---|
| 3,339,169 | A | * | 8/1967 | Freeland | 439/55 |
| 3,992,225 | A | * | 11/1976 | Sykes | 429/1 |
| 5,373,418 | A | * | 12/1994 | Hayasi | 361/707 |
| 5,853,058 | A | * | 12/1998 | Endo et al. | 180/65.1 |
| 6,935,020 | B2 | * | 8/2005 | Ikeda | 29/854 |
| 7,547,233 | B2 | * | 6/2009 | Inoue et al. | 439/627 |
| 2008/0241667 | A1 | * | 10/2008 | Kohn et al. | 429/159 |

* cited by examiner

*Primary Examiner*—Neil Abrams
(74) *Attorney, Agent, or Firm*—Muncy, Geissler, Olds & Lowe, PLLC

(57) ABSTRACT

A printed circuit board (PCB), which can be implemented on a battery set, having a plurality of soldering holes thereon. A soldering portion and a non-soldering portion are separately arranged around each of the soldering holes on both surfaces of the PCB. Each corresponding conductive stick can respectively pierce each soldering hole and be fixed to each soldering portion of the PCB with the fused solder or move from the soldering portion to the non-soldering portion in the soldering hole. Thus, this invention provides a convenient and efficient way for assembling the PCB on the battery set or disassembling the PCB apart from the battery set.

16 Claims, 2 Drawing Sheets

PCB WITH IMPROVED SOLDERING HOLES AND A BATTERY SET WITH THE SAME

RELATED APPLICATIONS

This application claims priority to Taiwan Application Serial Number 96219229, filed Nov. 14, 2007, which is herein incorporated by reference.

BACKGROUND

1. Field of Invention

This invention is related to a printed circuit board (PCB), and more particularly to the PCB with improved soldering holes adopted on a battery set.

2. Description of Related Art

The prior art of multiple series-parallel connection of a high power battery set includes a plurality of battery modules outwardly extending numbers of nickel sticks thereof, and a printed circuit board (PCB) having a number of welding openings which are arranged respectively corresponding to each of the nickel sticks. Each of the welding openings respectively has a closed tinning ring disposed around the welding opening on the PCB. When an assembling process of the multiple series-parallel connection of a high power battery set is proceeded with, an operator first makes each nickel stick upright thereof to aim at the corresponding welding opening, then moves the PCB to help each nickel stick to simultaneously pierce through its corresponding welding opening, and sequentially welds each nickel stick to fix on the closed tinning ring of the corresponding welding opening by fused solder. Therefore, the PCB will be firmly fixed on the battery modules.

However, there are several inconveniences during the steps of assembling the PCB on the battery modules. For example, due to the high ductility of the nickel sticks thereon, the nickel sticks are easily bended or curved. Therefore operators have to make every nickel stick straight one by one, then to respectively aim each welding opening at its corresponding nickel stick, and to move vertically towards the battery modules to help each nickel stick respectively to pierce through the corresponding welding opening by descending the PCB. If any one of the nickel sticks is not straight enough, the PCB will not be able to fix on the battery modules because each of the nickel sticks is unable to simultaneously pierce through its corresponding welding opening.

On the contrary, when operators try to disassemble the PCB away from the battery modules, operators first have to eradicate all the solder one by one between every nickel stick and the closed tinning ring, then to isolate each nickel stick not to physically connect the corresponding closed tinning ring, and to lift the PCB vertically away from the battery modules. However, it is difficult for operators to be aware only by his/her sight whether all the solder between every nickel stick and closed tinning ring are eradicated or not. Thus, if any of the nickel sticks physically connects to the corresponding closed tinning ring and still being solidified on the corresponding closed tinning ring, the operator is unable to disassemble the PCB away from the battery modules. To solve that, operators again need to eradicate all the solder one by one as operators are unable to know which one of the nickel sticks is still solidified on the corresponding closed tinning ring. In conclusion, the above structure of the PCB, which takes much time and manpower consumption to operators, must be improved.

SUMMARY

It is therefore an objective of the present invention to present a PCB with improved soldering holes and a battery set with the same, thus it provides a fulfillment of accelerated processes of assembling the PCB on the battery set and disassembling the PCB away from the battery set.

To achieve the foregoing objectives, the present invention provides a PCB with improved soldering holes, which can be implemented on a battery set, comprising a PCB body having a plurality of soldering holes made thereon, a plurality of soldering portions separately arranged around a part of each soldering hole on both two surfaces of the PCB body, and a plurality of non-soldering portions arranged around another part of each soldering hole on both surfaces of the PCB body, wherein each soldering hole can be respectively penetrated through by a corresponding conductive stick of the battery set. After that, each soldering hole provides its corresponding conductive stick therein to approach towards the soldering portion thereof for fixing on the PCB, or to divide from the soldering portion to the non-soldering portion in the soldering hole, thus to provide a convenient and efficient way for assembling the PCB on the battery set or disassembling the PCB apart from the battery set.

When one of the conductive sticks in the soldering hole approaches towards and physically connects the soldering portion thereof, the conductive stick will be fixed to the PCB body with the fused solder. On the other hand, when one of the conductive sticks in the soldering hole is moved away from the soldering portion to the non-soldering portion and peeled off from the fused solder and the soldering portion, the PCB body will be free to remove the conductive stick. Accordingly, the PCB can be disassembled apart from the battery set.

In a first embodiment of the present invention, each of the soldering holes presents an arc shape and is arranged away from the edges of the PCB body, each of the soldering portions is an electrically conductive layer consisting of tin in reality and presenting at least a "U" shape. Each of the non-soldering portions is the breach of the "U" shape of the soldering portion and is an electrically nonconducting layer as fiberglass of the PCB body in reality.

In a second embodiment of the present invention, the soldering holes are formed as gaps by respectively breaking an edge of the PCB body corresponding to the soldering holes on the edge of the PCB body. Each of the soldering portions is an electrically conductive layer consisting of tin in reality and presenting at least a "U" shape. Each of the non-soldering portions is the broken part of the edge of the PCB body.

Therefore, after the solder between the soldering portion and the conductive stick has been fused, the conductive stick can be pulled outwardly from the soldering portion towards the broken part of the edge of the PCB body to come off the PCB body. The PCB body will be free to remove from the conductive sticks. Accordingly, the PCB body can be disassembled apart from the battery set.

Therefore, the invention facilitates operation of the disassembling the PCB apart from the battery set. Thus, operators do not need to redo the fusion and eradication of all the solder between the soldering portions and the conductive sticks on by one, and do not need to ensure if all the solder thereof certainly is eradicated off. Therefore, the invention is to provide time saving from the fusion and the eradication of all the solder and accelerate the processes of assembling on and disassembling the PCB away from the battery set.

BRIEF DESCRIPTION OF THE DRAWINGS

The structure and the technical means adopted by the present invention to achieve the above and other objects can be best understood by referring to the following detailed description of the preferred embodiments and the accompanying drawings, where.

DESCRIPTION OF THE PREFERRED EMBODIMENTS

Figure 1:
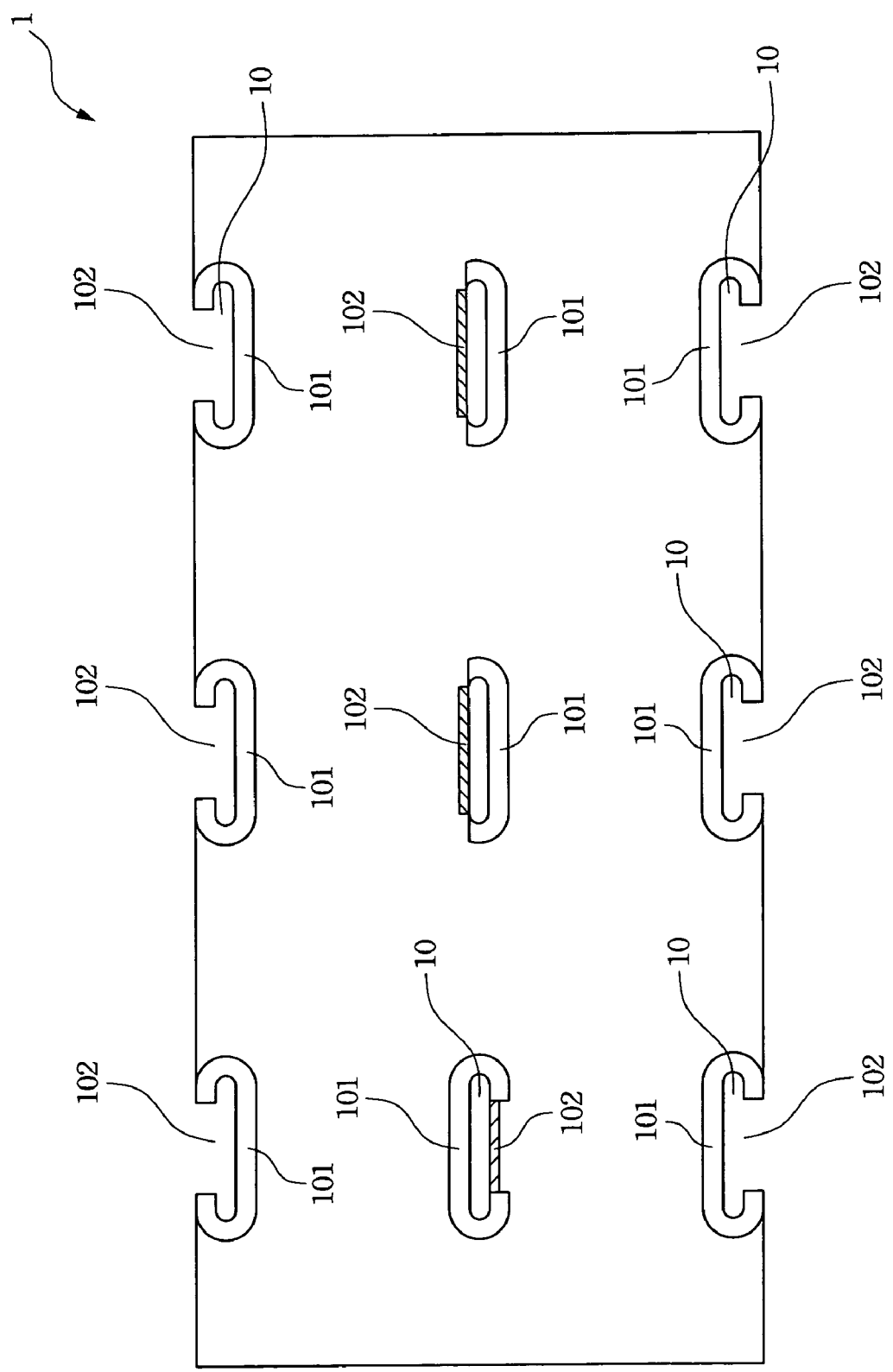
FIG. 1 is a schematic diagram of a PCB body with a plurality soldering holes.

It is to be understood that the following disclosure provides one or more preferred embodiment, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 2:
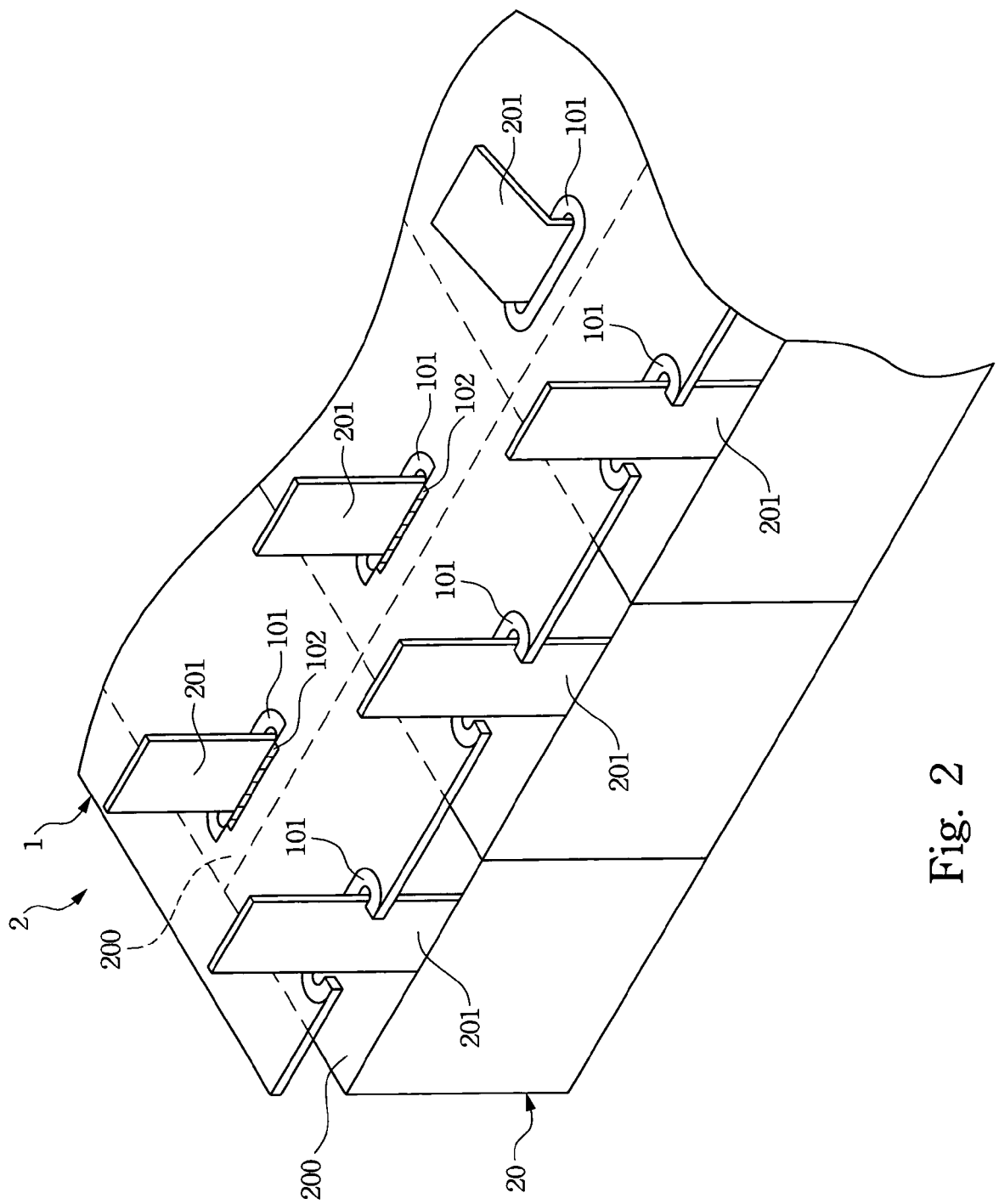
FIG. 2 is a schematic diagram of the PCB body assembled on a battery set.

FIG. 1 shows a schematic diagram of a PCB body with a plurality soldering holes, and FIG. 2 shows a schematic diagram of the PCB body assembled on a battery set. The present invention is to provide a printed circuit board (PCB) with improved soldering holes and a battery set with the PCB, Referring to FIG. 1. The PCB comprises a PCB body 1 and a plurality of soldering holes 10. The soldering holes 10 are separately made on the PCB body 1 and may be arranged on the edge of the PCB body 1 or away from the edge of the PCB body 1. A plurality of soldering portion 101 and non-soldering portion 102 are separately arranged around each of soldering holes 10 on both surfaces of the PCB body 1. Referring to FIG. 2. When the PCB body 1 is assembled with an electrical element (e.g. battery assembly 2) extending a plurality of conductive sticks 201 (e.g. nickel stick) outwardly respectively in which each of conductive sticks 201 respectively corresponds to one of the soldering holes 10 and penetrates through the corresponding soldering hole 10. Therefore, each soldering hole 10 provides its corresponding conductive stick 201 to approach towards the soldering portion 101 for fixing to the PCB body 1, or to move apart from the soldering portion 101 to the non-soldering portion 102 of the soldering hole 10, thus providing a convenient way for assembling the PCB on the battery assembly 2 or disassembling PCB apart from the battery assembly 2.

When one of the corresponding conductive sticks 201 in the soldering hole 10 approaches towards and physically connects the soldering portion 101, the corresponding conductive stick 201 will be fixed to the PCB body 1 with the fused solder. On the other hand, when one of the corresponding conductive sticks 201 in the soldering hole 10 is pulled apart from the soldering portion 101 to the non-soldering portion 102 and peeled off from the fused solder and the soldering portion 101, the PCB body will be free to separate from the corresponding conductive stick 201. Accordingly, the PCB can be dissasembled from the battery set.

In a first embodiment of the present invention, each of the soldering holes 10 is an arc shape opening arranged far away from the edge of the PCB body 1, as the soldering holes 10 positioned at the middle of the PCB body 1 shown on FIG. 1, each of the soldering portions 101 is an electrically conductive layer consisting of nickel and presenting at least a "U" shape (i.e. semicircular shape), and each of the non-soldering portions 102 is the breach of the "U" shaped soldering portion 101 and is an electrically nonconducting layer as fiberglass of the PCB body 1.

In practice, after the solder is fused, the conductive stick 201 in the corresponding soldering hole 10 can be pulled from the electrically conductive layer towards the electrically nonconducting layer. The conductive stick 201 will no longer be fixed to the electrically conductive layer with the fused solder once the fused solder is cooling again. Therefore, the conductive stick 201 is free to separate from the corresponding soldering hole 10.

In a second embodiment of the present invention, each of the soldering holes 10 is arranged on an edge of the PCB body 1 as the soldering holes 10 positioned at each edge of the PCB body 1 shown on FIG. 1, and is formed by breaking the edge of the PCB body 1 corresponding to the soldering holes 10. Each of the soldering portions 101 is an electrically conductive layer consisting of tin and presenting at least a "U" shape (i.e. semicircular shape), and each of the non-soldering portions 102 is the broken part of the edge of the PCB body 1. Therefore, when a conductive stick 201 in the corresponding soldering hole 10 would be separate from the corresponding soldering hole 101, the conductive stick 201 can be pulled outwardly from the soldering portion 101 towards the broken part of the edge of the PCB body 1 to come off the PCB body 1 after the solder between the soldering portion 101 and the conductive stick 201 is fused. The PCB body 1 will be free to divide from the conductive stick 201. Accordingly, the PCB body 1 can be disassembled from the battery assembly 2.

In the first and second embodiments disclosed above, the soldering portion 101 might cause an unfavorable solidification with the corresponding conductive stick 201 because the contacting area between the "U" shaped soldering portion 101 and the conductive stick 201 is less than the contacting area between the closed tinning ring (i.e. circular shape) and the nickel stick in the foregoing prior art. Therefore, the "U" shaped soldering portion 101 of the PCB body 1 might possibly fail to tightly grab the corresponding conductive stick 201 and worsen the electrical conductivity between the battery set and the PCB. In view of the "U" shaped soldering portion 101 bringing less contacting area with the conductive stick 201, a third embodiment discloses that a "C" shape (i.e. a shape between the semicircular shape and circular shape) is presented on each of the soldering portions 101 instead of the "U" shape thereon, as the soldering hole 10 positioned at the middle to right of the PCB body 1 shown on FIG. 1, thus to aim at adding the contacting area between the "C" shaped soldering portion 101 and the conductive stick 201 more than the one between the "U" shaped soldering portion 101 and the conductive stick 201. However, one thing that needs to be limited is each of the non-soldering portions 102 which means the opening part of the C shape of the soldering portion 101 or the position of the broken edge of the PCB body 1, must be larger or at least equal to the corresponding conductive stick 201 to provide a space for the corresponding conductive stick 201 to leave the soldering portion 101 when the corresponding conductive stick 201 is pulled away towards the non-soldering portion 102.

Simultaneously referring to FIGS. 1 and 2 again, the present invention of PCB 1 with improved soldering holes 10 can be further implemented on a multiple series-parallel connection of high power battery set. The battery set comprises a battery assembly 2 and the foregoing PCB body 1. The battery assembly 2 comprises a plurality of battery modules 20 connecting in parallel with each other and each of the battery modules 20 consisting of a plurality of battery cells 200 connecting in series, and a plurality of conductive sticks 201 disposed respectively on a side of each battery modules 20 and extending outwardly. The foregoing PCB body 1 has some soldering holes 10 as discussed in the first embodiment and positioning at middle of the PCB body 1 shown on FIG. 1, and other soldering holes 10 as discussed in the second embodiment and positioning at two edges of the PCB body 1 shown on FIG. 1.

When an operator starts to assemble the PCB body 1 on the battery assembly 2, the operator only needs to do two tasks. One of the tasks is to pull the conductive sticks 201 near the edges of the battery modules 20 to lean outwardly; to move the PCB body 1 towards the battery assembly 2; to help the conductive sticks 201 disposed on the middle of the battery modules 20 to perpetrate through the corresponding soldering holes 10; and to sequentially fix each of the conductive sticks 201 on the soldering portion 101 of the corresponding soldering hole 10 with the fused solder.

After that, the operator then does another task to respectively pull back the leaned conductive sticks 201 near the edges of the battery modules 20 into the corresponding soldering holes 10 and to fix each of the conductive sticks 201 on the edges of the battery modules 20 to the soldering portion 101 of the corresponding soldering hole 10 with the fused solder. Therefore, compared to conventional steps of assembling a PCB on the battery assembly 2, the present invention provides much more time saved from aiming the welding openings by nickel stick, and accelerates processes of assembling the PCB body 1 on the battery assembly 2.

When the operator tries to disassemble the PCB body 1 apart from the battery assembly 2, regardless if the operator starts on the conductive sticks 201 near the edges or the conductive sticks 201 on the middle of the battery modules 20, the operator only needs to circularly do the steps of fusing the solder between the conductive stick 201 and the corresponding soldering portion 101; and pulling the conductive stick 201 away from the corresponding soldering portion 101 towards the corresponding non-soldering portion 102 before the fused solder is getting cool. Once the fused solder is cooling, the conductive stick 201 will no longer be fixed to the corresponding soldering portion 101 with the fused solder, when the conductive stick 201 is pulled back to contact the corresponding soldering portion 101. Therefore, the PCB body 1 is free to separate from the battery assembly 2 until all the conductive sticks 201 are respectively pulled away from the corresponding soldering portion 101.

Compared to conventional steps of disassembling a PCB body 1 apart from the battery assembly 2, the present invention eliminates the step of eradication of fused solder and provides substantial time saved from eradicating the fused solder. Therefore, the present invention directly moves to the step of pulling the conductive sticks 201 away from the corresponding soldering portion 101 to accelerate processes of disassembling the PCB apart from the battery set.

Although the present invention has been described in considerable detail with reference in the certain preferred embodiments thereof, other embodiments are possible. Therefore, the spirit and scope of the appended claims should not be limited to the description of the preferred embodiments contained herein.

It will be apparent to those skilled in the art that various modifications and variations can be made to the structure of the present invention without parting from the scope or spirit of the invention. In view of the foregoing, it is intended that the present invention cover modifications and variations of this invention provided they fall within the scope of the following claims and their equivalents.

What is claimed is:

1. A PCB with improved soldering holes, comprising:
   a printed circuit board (PCB) body having a plurality of soldering holes thereon wherein each of the soldering holes is provided to be respectively penetrated through by a corresponding conductive stick of a battery set;
   a plurality of soldering portions separately arranged around a part of each soldering hole on both surfaces of the PCB body and providing the corresponding conductive stick in the soldering hole to approach towards the soldering portion for fixing on the PCB body; and
   a plurality of non-soldering portions separately arranged around another part of each soldering hole on both surfaces of the PCB body, and providing the corresponding conductive stick in the soldering hole to separate from the soldering portion towards the non-soldering portion for not fixing on the PCB body.

2. The PCB as claimed in claim 1, wherein each of the soldering holes presents an arc shape and is arranged away from an edge of the PCB body;
   each of the soldering portions is an electrically conductive layer presenting a "U" shape; and
   each of the non-soldering portions is an electrically non-conducting layer and is the breach of the "U" shape of the soldering portion.

3. The PCB as claimed in claim 2, wherein each of the electrically conductive layers presents a "C" shape for adding the contacting area between the electrically conductive layer and the conductive stick.

4. The PCB as claimed in claim 2, wherein the electrically conductive layer is made by tin.

5. The PCB as claimed in claim 2, wherein the electrically nonconducting layer is made by fiberglass.

6. The PCB as claimed in claim 1, wherein some of the soldering holes are formed as gaps by respectively breaking an edge of the PCB body corresponding to the soldering holes on the edge of the PCB body;
   each of the soldering portions is an electrically conductive layer presenting a "U" shape; and
   each of the non-soldering portions is a broken part of the edge of the PCB body.

7. The PCB as claimed in claim 6, wherein the electrically conductive layer is made by tin.

8. The PCB as claimed in claim 6, wherein each of the electrically conductive layers presents a "C" shape for adding the contacting area between the electrically conductive layer and the conductive stick.

9. A battery set with a PCB with improved soldering holes, comprising:
   a battery assembly comprising:
   a plurality of battery modules connecting in parallel with each other and each of the battery modules consisting of a plurality of battery cells connecting in series; and
   a plurality of conductive sticks disposed respectively on a side of each battery modules and extending outwardly; and
   a printed circuit board (PCB), comprising:
   a PCB body having a plurality of soldering holes thereon and each of soldering holes respectively corresponding to a conductive stick and being penetrated through by the corresponding conductive stick;
   a plurality of soldering portions separately arranged around a part of each soldering hole on both surfaces of the PCB body and providing the corresponding conductive stick in the soldering hole to approach towards the soldering portion for fixing on the PCB body; and a plurality of non-soldering portions separately arranged around another part of each soldering hole on both surfaces of the PCB body, and providing the corresponding conductive stick in the soldering hole to separate from the soldering portion to the non-soldering portion.

10. The battery set as claimed in claim 9, wherein each of the soldering holes presents an arc shape and is arranged away from an edge of the PCB body;

each of the soldering portions is an electrically conductive layer presenting a "U" shape and;

each of the non-soldering portions is an electrically nonconducting layer and is the breach of the "U" shape of the soldering portion.

11. The PCB as claimed in claim 10, wherein each of the electrically conductive layers presents a "C" shape for adding the contacting area between the electrically conductive layer and the conductive stick.

12. The battery set as claimed in claim 10, wherein the electrically conductive layer is made by tin.

13. The battery set as claimed in claim 10 wherein the electrically nonconducting layer is made by fiberglass.

14. The battery set as claimed in claim 9, wherein some of the soldering holes are formed as gaps by respectively breaking an edge of the PCB body corresponding to the soldering holes on the edge of the PCB body;

each of the soldering portions is an electrically conductive layer presenting a "U" shape and;

each of the non-soldering portions is a broken part of the edge of the PCB body.

15. The battery set as claimed in claim 14, wherein the electrically conductive layer is made by tin.

16. The PCB as claimed in claim 14, wherein each of the electrically conductive layers presents a "C" shape for adding the contacting area between the electrically conductive layer and the conductive stick.

* * * * *